(12) United States Patent
Khwa et al.

(10) Patent No.: US 12,205,670 B2
(45) Date of Patent: Jan. 21, 2025

(54) MEMORY SYSTEM AND OPERATING METHOD OF MEMORY SYSTEM

(71) Applicant: Taiwan Semiconductor Manufacturing Company, Ltd., Hsinchu (TW)

(72) Inventors: Win-San Khwa, Taipei (TW); Ping-Chun Wu, Hsinchu (TW); Tung Ying Lee, Hsinchu (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 166 days.

(21) Appl. No.: 17/821,187

(22) Filed: Aug. 21, 2022

(65) Prior Publication Data

US 2023/0317124 A1 Oct. 5, 2023

Related U.S. Application Data

(60) Provisional application No. 63/362,470, filed on Apr. 5, 2022.

(51) Int. Cl.

| | |
|---|---|
| *G11C 7/10* | (2006.01) |
| *G06F 7/48* | (2006.01) |
| *G06N 3/063* | (2023.01) |
| *G11C 7/12* | (2006.01) |
| *G11C 8/08* | (2006.01) |

(52) U.S. Cl.
CPC .......... *G11C 7/1096* (2013.01); *G06F 7/4824* (2013.01); *G06N 3/063* (2013.01); *G11C 7/1069* (2013.01); *G11C 7/12* (2013.01); *G11C 8/08* (2013.01)

(58) Field of Classification Search
CPC .................................................. G11C 7/1096
See application file for complete search history.

(56) References Cited

U.S. PATENT DOCUMENTS

| | | | |
|---|---|---|---|
| 10,340,002 B1 * | 7/2019 | Kim | G11C 13/0038 |
| 11,169,742 B2 * | 11/2021 | Maejima | G06F 3/0679 |
| 2020/0202204 A1 | 6/2020 | Kouno et al. | |

FOREIGN PATENT DOCUMENTS

| | | |
|---|---|---|
| CN | 11383336 B | 2/2022 |
| TW | 202209136 A | 3/2022 |
| WO | WO 2019/049741 A1 | 3/2019 |

* cited by examiner

*Primary Examiner* — Douglas King

(74) *Attorney, Agent, or Firm* — Finnegan, Henderson, Farabow, Garrett & Dunner, L.L.P.

(57) ABSTRACT

Memory systems and operating method of a memory system are provided. The memory system utilized for performing a computing-in-memory (CiM) operation comprises a memory array and a processing circuit. The memory array comprises a plurality of memory cells. The processing circuit is coupled to the memory array and comprises a programming circuit and a control circuit. The programming circuit is coupled to the memory array and configured to perform a write operation for programming electrical characteristics of the memory cells. The control circuit is coupled to the programming circuit and configured to: receive a plurality of weight data corresponding to a plurality of weight values; and control the write operation performed by the programming circuit, so the electrical characteristics of the memory cells are programmed following a sequential order of the weight values.

20 Claims, 9 Drawing Sheets

200a Program operation to MLC when weight data are unsigned numbers

| Weight data | Weight value | Cell Resistance (KΩ) | 1/R (1/KΩ) |
|---|---|---|---|
| 11 | 3 | 50KΩ | 0.0200 |
| 10 | 2 | 75KΩ | 0.0133 |
| 01 | 1 | 150KΩ | 0.0067 |
| 00 | 0 | 5MΩ | 0.0002 |

200b Program operation to MLC when weight data are signed numbers

| Weight data | Weight value | Cell Resistance (KΩ) | 1/R (1/KΩ) |
|---|---|---|---|
| 01 | 1 | 50KΩ | 0.0200 |
| 00 | 0 | 75KΩ | 0.0133 |
| 11 | -1 | 150KΩ | 0.0067 |
| 10 | -2 | 5MΩ | 0.0002 |

Fig. 2A

200c Program operation to the TLC when weight data are unsigned numbers

| Weight data | Weight value | Cell Resistance (KΩ) | 1/R (1/KΩ) |
|---|---|---|---|
| 111 | 7 | 50 | 0.0200 |
| 110 | 6 | 58.3 | 0.0172 |
| 101 | 5 | 70 | 0.0143 |
| 100 | 4 | 87.5 | 0.0114 |
| 011 | 3 | 117 | 0.0085 |
| 010 | 2 | 175 | 0.0057 |
| 001 | 1 | 350 | 0.0029 |
| 000 | 0 | 5000 | 0.0002 |

200d Program operation to the TLC when weight data are signed numbers

| Weight data | Weight value | Cell Resistance (KΩ) | 1/R (1/KΩ) |
|---|---|---|---|
| 011 | 3 | 50 | 0.0200 |
| 010 | 2 | 58.3 | 0.0172 |
| 001 | 1 | 70 | 0.0143 |
| 000 | 0 | 87.5 | 0.0114 |
| 111 | -1 | 117 | 0.0085 |
| 110 | -2 | 175 | 0.0057 |
| 101 | -3 | 350 | 0.0029 |
| 100 | -4 | 5000 | 0.0002 |

Read operation to MLC when weight data are unsigned numbers

| Weight data | Data read | Weight value | Cell Resistance (KΩ) | 1/R (1/KΩ) |
|---|---|---|---|---|
| 111 | 111 | 7 | 50 | 0.0200 |
| 110 | 110 | 6 | 58.3 | 0.0172 |
| 101 | 101 | 5 | 70 | 0.0143 |
| 100 | 100 | 4 | 87.5 | 0.0114 |
| 011 | 011 | 3 | 117 | 0.0085 |
| 010 | 010 | 2 | 175 | 0.0057 |
| 001 | 001 | 1 | 350 | 0.0029 |
| 000 | 000 | 0 | 5000 | 0.0002 |

300d

Read operation to TLC when weight data are signed numbers

| Weight data | Data read | Weight value | Cell Resistance (KΩ) | 1/R (1/KΩ) |
|---|---|---|---|---|
| 011 | 111 | 3 | 50 | 0.0200 |
| 010 | 110 | 2 | 58.3 | 0.0172 |
| 001 | 101 | 1 | 70 | 0.0143 |
| 000 | 100 | 0 | 87.5 | 0.0114 |
| 111 | 011 | -1 | 117 | 0.0085 |
| 110 | 010 | -2 | 175 | 0.0057 |
| 101 | 001 | -3 | 350 | 0.0029 |
| 100 | 000 | -4 | 5000 | 0.0002 |

Fig. 3C

| Sum | Weight Value | | | | Cell Resistance (KΩ) | | | | Req | 1/Req |
| --- | --- | --- | --- | --- | --- | --- | --- | --- | --- | --- |
| | MC1 | MC2 | MC3 | MC4 | MC1 | MC2 | MC3 | MC4 | | |
| -8 | -2 | -2 | -2 | -2 | 5000 | 5000 | 5000 | 5000 | 1250.0 | 0.001 |
| -7 | -2 | -2 | -2 | -1 | 5000 | 5000 | 5000 | 150 | 137.6 | 0.007 |
| -6 | -2 | -2 | -1 | -1 | 5000 | 5000 | 150 | 150 | 72.8 | 0.014 |
| -6 | -2 | -2 | -2 | 0 | 5000 | 5000 | 5000 | 75 | 71.8 | 0.014 |
| -5 | -2 | -1 | -1 | -1 | 5000 | 150 | 150 | 150 | 49.5 | 0.020 |
| -5 | -2 | -2 | -1 | 0 | 5000 | 5000 | 150 | 75 | 49.0 | 0.020 |
| -5 | -2 | -2 | -2 | 1 | 5000 | 5000 | 5000 | 50 | 48.5 | 0.021 |
| -4 | -1 | -1 | -1 | -1 | 150 | 150 | 150 | 150 | 37.5 | 0.027 |
| -4 | -2 | -1 | -1 | 0 | 5000 | 150 | 150 | 75 | 37.2 | 0.027 |
| -4 | -2 | -2 | -1 | 1 | 5000 | 5000 | 150 | 50 | 36.9 | 0.027 |
| -4 | -2 | -2 | 0 | 0 | 5000 | 5000 | 75 | 75 | 36.9 | 0.027 |

MEMORY SYSTEM AND OPERATING METHOD OF MEMORY SYSTEM

CROSS-REFERENCE TO RELATED PATENT APPLICATIONS

This application claims priority to U.S. Provisional Application No. 63/362,470, filed on Apr. 5, 2022, entitled "Memory system and method of operating the same," which application is hereby incorporated herein by reference in its entirety.

BACKGROUND

Implementations of high performance computing (HPC), such as artificial intelligence (AI), deep learning (DL), machine learning (ML), enhanced learning, etc., often involve a great amount of matrix multiplications, whose speed is limited by the accessing speed of a memory, which is also referred as a Von Neuman bottleneck. In view of this speed limitation, a compute-in-memory (CiM) architecture has attracted attention, arising from its potential to break through the von Neuman bottleneck in current computing architecture.

BRIEF DESCRIPTION OF THE DRAWINGS

Aspects of the present disclosure can be understood from the following detailed description and the accompanying figures. It is noted that, in accordance with the standard practice in the industry, various features are not drawn to scale. In fact, the dimensions of the various features may be arbitrarily increased or reduced for illustration or clarity of discussion.

FIG. 2A illustrates tables for a program operation on multi-level cells (MLCs) when weight data are respectively unsigned and signed numbers, in accordance with some embodiments.

FIG. 2B illustrates tables for a program operation on tri-level cells (TLCs) when weight data are respectively unsigned and signed numbers, in accordance with some embodiments.

FIG. 3C illustrates tables for a read operation performed on a TLC when weight data are respectively unsigned and signed numbers, in accordance with some embodiments.

FIG. 4B illustrates a read operation performed by a readout circuit when weight data are signed numbers, in accordance with some embodiments.

DETAILED DESCRIPTION

Figure 1:
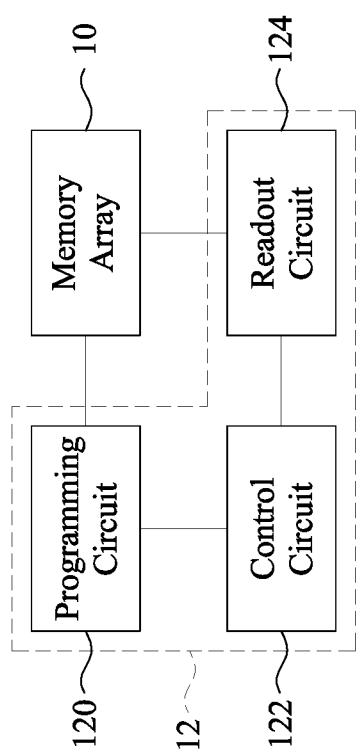
FIG. 1 illustrates a schematic block diagram of a memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," "over," and the like, may be used herein for ease of description to describe one element or feature's relationship to another element(s) or feature(s), including those illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain region(s) may refer to a source or a drain, individually or collectively dependent upon the context.

FIG. 1 illustrates a schematic block diagram of a memory system 1, in accordance with some embodiments. The memory system 1 may be utilized for performing a compute-in-memory (CiM) operation. The memory system 1 comprises a memory array 10 and a processing circuit (also referred to as a controller) 12 coupled to the memory array 10. The processing circuit 12 is configured to control operations of the memory array 10. The processing circuit 12 is configured to perform at least one of a write operation (also referred to as a program operation) or a read operation on the memory array 10. In some embodiments, the memory system 1 is integrated and disposed on a single die in a system on a chip (SOC) manner. In some embodiments, the memory system 1 is included as a part of a larger IC device which comprises circuitry other than the memory system for other functionalities. In some embodiments, the memory system 1 is disposed on at least one chip.

In the exemplary configuration of the memory system 1 in FIG. 1, although not illustrated, the memory array 10 comprises a plurality of memory cells arranged in columns and rows. A memory cell may comprise at least one memory element. Electrical characteristics (e.g., resistance or threshold voltage or other suitable electrical characteristics) of each memory element can be programmed at different levels. Therefore, the memory cell can store data by programming electrical characteristics of the memory element at a corresponding level. In some embodiments, each of the memory cells in the memory array 10 is a multi-level cell (MLC), a tri-level cell (TLC), a quadra-level cell (QLC), or the like. In some embodiments, the memory system 1 comprising the plurality of memory cells is configured as one of an MLC, TLC, or QLC memory for storing data. In one or more embodiments, the MLC, TLC, or QLC memory is further configured for performing the CiM operation. In at least one embodiment, it is possible to achieve one or more advantages including, but not limited to, a larger memory window (margin for reading data from memory), better computation performance, or the like.

The memory array 10 further comprises a plurality of word lines, a plurality of source lines, and at least one bit line. Each of the memory cells is coupled to the processing circuit 12 through a corresponding bit line and a corresponding word line. The word lines are configured for transmitting addresses of memory cells, or memory elements in the memory cell, to be read from, and/or to be written to, or the like. The word lines are sometimes referred to as "address lines." The at least one bit line and/or the source lines are configured for transmitting data to be written to, and/or read from, the memory cells, or memory elements in the memory cell, indicated by the addresses on the corresponding word lines, or the like. The at least one bit line and/or the source lines are sometimes referred to as "data lines." Various numbers of word lines, bit lines, and/or source lines in the memory array 10 are within the scope of various embodiments.

Examples of memory elements, which are programmable to have different electrical characteristic values, include, but are not limited to, resistive random access memory (ReRAM or RRAM), magnetic RAM (MRAM), phase change memory (PCM), flash memory comprising charge storage material or floating gate, or the like. Both NOR and NAND gate flash memories are applicable to implement memory elements of the memory cell in one or more embodiments. An RRAM, MRAM or PCM memory element comprises an access transistor electrically coupled in series with a memory layer. The memory layer is programmable to have two or more states corresponding to two or more resistance values of the memory element. The gate of the access transistor of the RRAM, MRAM, or PCM memory element corresponds to a control terminal of the memory element, and is electrically coupled to a corresponding word line. A flash memory element comprises a transistor having a floating gate or a charge storage layer. The floating gate or charge storage layer is programmable to store two or more levels of charges corresponding to two or more resistance values of the memory element. The gate of the transistor of the flash memory element corresponds to a control terminal of the memory element, and is electrically coupled to a corresponding word line. Other types or configurations of memory elements are also within the scope of various embodiments.

The processing circuit 12 comprises a programming circuit 120, a control circuit 122, and a readout circuit 124. In at least one embodiment, the processing circuit 12 further includes one or more clock generators for providing clock signals for various components of the memory system 1, one or more input/output (I/O) circuits for data exchange with external devices, and/or one or more controllers for controlling various operations in the memory system 1.

The programming circuit 120 is coupled to the memory cells of the memory array 10 through the at least one bit line and the source lines to perform the write operation on at least one memory cell of the memory array 10. In at least one embodiment, the processing circuit 12 further includes a word line driver (also referred to as a "word line decoder") coupled to the memory array 10 via the word lines. The word line driver is configured to decode a row address of a selected memory cell selected to be accessed in a read operation or a write operation. In at least one embodiment, the write operation is performed, by the programming circuit 120, on a selected memory cell by controlling voltages on the corresponding source line, so an electrical characteristic of the selected memory cell can be adjusted to a level corresponding to the voltages applied.

The readout circuit 124 is coupled to the memory cells of the memory array 10 through the at least one bit line to perform the read operation on at least one memory cell of the memory array 10. In at least one embodiment, the readout circuit 124 further includes a sense amplifier coupled to the memory array 10 via the at least one bit line. The sense amplifier is configured to readout electrical characteristics of the memory cells from the at least one bit line in the read operation.

The control circuit 122 is coupled to the programming circuit 120 and the readout circuit 124 to control the write operation and/or the read operation performed on the memory array 10. In at least one embodiment, the control circuit 122 is configured to receive a plurality of weight data corresponding to a plurality of weight values, and control the programming circuit 120 to perform the write operation on the memory cells, so the electrical characteristics of the memory cells can be programmed to follow an order of the weight values. In at least one embodiment, the electrical characteristics of the respective memory cells are programmed following a sequential order of the weight values. The electrical characteristic of each memory cell is consistently increased or decreased as the weight value increases or decreases. Examples of the control circuit 122 include, but are not limited to, a central processing unit (CPU), a memory controller, a microprocessor control unit (MCU), an application specific integrated circuit, (ASIC), circuit implementations of field programmable gate array (FPGA), or circuit implementations from hardware description languages (e.g., Verilog, VHDL), or the like. Other types or configurations of control circuits 122 are also within the scope of various embodiments.

For example, in a write operation, a selected memory cell is configured to be supplied with a write voltage through a corresponding word line. Further, a low voltage is also provided to the selected memory cell through a corresponding bit line and/or a corresponding source line by the programming circuit 120. Therefore, a sufficiently large voltage difference is provided to the selected memory cell for performing the write operation. For unselected memory cells, a high voltage is provided to the corresponding bit lines of the unselected memory cells. Therefore, an insufficient voltage is provided to those unselected memory cells.

More particularly, orders of the weight data with respect to weight value are different for signed numbers and unsigned numbers. Table 1 below shows examples of weight data and weight values of two-bit signed and unsigned numbers arranged in bit order. For example, the bit order of the weight data increases as a binary value of the weight data increases following this order: 00, 01, 10, 11. As shown in Table 1, weight data of the signed and unsigned numbers are listed by bit order. For the unsigned numbers, the weight value monotonically increases following a bit order of the weight data. However, for the signed numbers, the weight values do not monotonically increase or monotonically decrease as the bit order of the weight data increases. When a sign bit of the signed number is unchanged, the weight value of the signed number increases following the bit order of the weight data. However, when the sign bit of the signed number changes (e.g., from the weight data of 01 to 10), the weight value of the signed number is decreased but the bit order of the weight data increases. In other words, a bit order of the weight data and a sequential order of the weight values for the unsigned numbers are the same, but different for the signed numbers. Such discrepancy between the bit order of the weight data and the sequential order of the weight values causes additional conversion to be required by the control circuit 122 while performing the write operation of the signed numbers, so the electrical characteristic of the memory cell can be programmed following the sequential order of the corresponding weight value. In other words, the electrical characteristics of the memory cells are programmed following an order of the weight values rather than the bit order of the weight data received by the control circuit 102. In this example, although the weight values are respectively encoded in two's complement notation as the weight data, it should be noted that other suitable encoding mechanisms, such as one's complement, for signed numbers are also within the scope of various embodiments.

TABLE 1

| Two-bit Unsigned Numbers | | Two-bit Signed Numbers | |
| --- | --- | --- | --- |
| Weight Data | Weight Value | Weight Data | Weight Value |
| 11 | 3 | 11 | −1 |
| 10 | 2 | 10 | −2 |
| 01 | 1 | 01 | 1 |
| 00 | 0 | 00 | 0 |

In at least one embodiment, the processing circuit 12 further includes a register coupled to the control circuit 122. The register is configured to store a table recording programming parameters corresponding to all weight data of both signed and unsigned numbers. The programming parameters may be, for example but without limitation, a write voltage to be applied on the corresponding source line and/or the corresponding bit line. As such, the control circuit 122 may identify whether the received weight data are signed or unsigned numbers, to obtain the appropriate programming parameter from the stored table according to the identification result and the received weight data, so an electrical characteristic of the selected memory cell can be programmed following a sequential order of the corresponding weight value.

Alternatively, in addition to including a register, the processing circuit 12 may include conversion logic coupled to the control circuit 122 for data conversion. For example, the conversion logic may be configured to perform data conversion on the weight data of signed numbers. When it is determined that the weight data are unsigned numbers, the conversion logic may be disabled, so the weight data of the unsigned numbers may be directly provided to the programming circuit 120 during the write operation. When it is determined that the weight data are signed numbers, the conversion logic may be enabled to convert the weight data into the weight values, so the programming circuit 120 is enabled to program the electrical characteristic of the memory cell following a sequential order the weight values during the write operation.

FIG. 2A illustrates tables 200a, 200b of a program operation on MLCs when weight data are unsigned and signed numbers, in accordance with some embodiments. The table 200a shows weight data of the unsigned numbers to be programmed, weight values corresponding to the weight data, and electrical characteristics, including cell resistance and conductance, for programming the MLC. In the table 200a, the weight values are arranged in sequential order in the second column, with corresponding weight data to be programmed in the first column, and corresponding electrical characteristics of the MLC in the third and fourth columns. As can be observed, the cell resistance and the conductance of the MLC respectively decrease and increase as the weight value of the unsigned number increases. In addition, the bit order of the weight data is consistent with the sequential order of the weight value.

The table 200b shows weight data of the signed numbers to be programmed, weight values corresponding to the weight data, and electrical characteristics, including cell resistance and conductance, for programming the MLC. In the table 200b, the weight values are arranged in sequential order in the second column, with corresponding weight data to be programmed in the first column, and corresponding electrical characteristics of the MLC in the third and fourth columns. Similarly, as the weight value increases, the cell resistance of the MLC decreases and the conductance of the memory cell increases. Therefore, in the tables 200a, 200b, an order of the electrical characteristic, either the cell resistance or the conductance, is programmed following a sequential order of the weight value, and such order of the electrical characteristic with respect to the sequential order of the weight value are the same when programmed with the signed and unsigned numbers.

FIG. 2B illustrates tables 200c, 200d of a program operation on TLCs when weight data are unsigned and signed numbers, in accordance with some embodiments. The table 200c shows weight data of the unsigned numbers to be programmed, weight values corresponding to the weight data, and electrical characteristics, including cell resistance and conductance, for programming the TLC. In the table 200c, the weight values are arranged in sequential order in the second column, with corresponding weight data to be programmed in the first column, and corresponding electrical characteristics of the TLC in the third and fourth columns. As can be observed, the cell resistance and the conductance of the TLC respectively decrease and increase as the weight value of the unsigned number increases. In addition, the bit order of the weight data is consistent with the sequential order of the weight value.

The table 200d shows weight data of the signed numbers to be programmed, weight values corresponding to the weight data, and electrical characteristics, including cell resistance and conductance, for programming the TLC. In the table 200d, the weight values are arranged in sequential order in the second column, with corresponding weight data to be programmed in the first column, and corresponding electrical characteristics of the TLC in the third and fourth columns. Similarly, as the weight value increases, the cell resistance of the TLC decreases and the conductance of the memory cell increases. Therefore, in the tables 200c, 200d, an order of the electrical characteristic, either the cell resistance or the conductance, is programmed following a sequential order of the weight value, and such order of the electrical characteristic with respect to the sequential order of the weight value are the same when programmed with the signed and unsigned numbers.

Further, as for the electrical characteristics of the unsigned numbers, either in two-bit or three-bit, the cell resistance is inversely proportional to the weight value, while the conductance is directly proportional to the weight value. More particularly, the programmed conductance is linearly related to the weight values, further benefitting the CiM operations performed with the MLCs. The CiM operations will be described in greater details below.

For example, in a read operation, a selected memory cell is configured to be supplied with a read voltage through a corresponding word line to sufficiently enable the selected memory cell. Further, a readout current is also provided to the selected memory cell through a corresponding source line. Therefore, the selected memory cell is enabled for performing the read operation, and a current flowing through the memory cell is determined by the electrical characteristic of the memory element within the memory cell which is programmed at a level corresponding to the weight data, and provided to a corresponding bit line. A sense amplifier is configured to receive the current and to compare it with at least one current threshold to determine a level of the received current. Thus, data stored in the selected memory cell can be obtained through the comparison result generated by the sense amplifier.

Figures 3A, 3B:
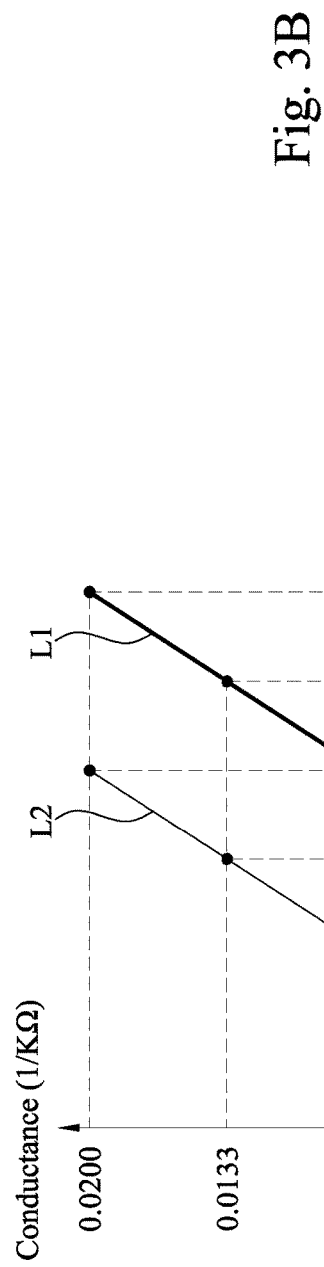
FIG. 3A illustrates tables for a read operation performed on MLCs when weight data are respectively unsigned and signed numbers, in accordance with some embodiments.
FIG. 3B illustrates a data conversion performed by a readout circuit when a read operation is performed on the MLC storing weight data of signed numbers, in accordance with some embodiments.

FIG. 3A illustrates tables 300a, 300b of a read operation performed on MLCs when weight data are unsigned and signed numbers, in accordance with some embodiments. The table 300a shows stored weight data of the unsigned numbers, weight values corresponding to the weight data, and electrical characteristics, including cell resistance and conductance, of the MLC to be read. In the table 300a, a sequential order of the weight values and a bit order of the weight data are the same, so an order of the electrical characteristics, particularly the conductance, read from the MLC also follows the bit order of the weight data.

The table 300b shows the stored weight data of the signed numbers, weight values corresponding to the weight data, and electrical characteristics, including cell resistance and conductance, of the MLC to be read. In the table 300b, a sequential order of the weight values and a bit order of the weight data are different, which renders an order of the electrical characteristics, particularly the conductance, read from the MLC inconsistent with the bit order of the weight data.

In at least one embodiment, the read operation is performed by the readout circuit 124 sensing a level of the current flowing through the memory cell. One of the advantages of the electrical characteristic being programmed to follow the sequential order of the weight values is that when the read operation is performed on the MLC storing weight data of unsigned numbers, a sequential order of the electrical characteristic specified by the readout circuit 124 may be easily utilized as the weight data of unsigned numbers, since the order of the electrical characteristics, either the resistance or the conductance, read from the MLC is consistent with the bit order of the weight data. Therefore, simple or no data conversion is required when the read operation is performed on the MLC storing the weight data of unsigned numbers. In at least one embodiment, when the read operation is performed on the MLC storing weight data of signed numbers, additional data conversion is required by the readout circuit 124 since the comparison result from the sense amplifier specifies the electrical characteristics of the MLC as unsigned numbers.

FIG. 3B illustrates a data conversion performed by the readout circuit 124 when the read operation is performed on an MLC storing weight data of signed numbers, in accordance with some embodiments. Two lines L1, L2 are illustrated in FIG. 3B, respectively correspond to relationships between the conductance and the weight values of the unsigned and signed numbers. In at least one embodiment, the readout circuit 124 reads the conductance from the MLC and generates a first readout data of an unsigned data. The first readout data corresponds to the data listed in the second column of the table 300b illustrated in FIG. 3A, and also covers a range of weight values from 0 to 3 as illustrated on the line L1 in FIG. 3B. In order to convert the first readout data from unsigned to signed, the line L1 is required to be left-shifted by an offset of $2^{n-1}$ to the line L2, where n is a number of bits carried by each weight data, i.e., 2, in this embodiment. Sometimes, n is also referred as a bit number of the weight data. The operation of shifting the line L1 left by $2^{n-1}$ corresponds to a data conversion of subtracting $2^{n-1}$ from the first readout data. For example, with reference to the first row in the table 300b, where the first readout data is 11, by subtracting the data 10, which corresponds to the binary value $2^{2-1}$, a signed readout data 01 corresponding to the weight data programmed on the MLC is calculated. Thus, during the read operation to read the weight data of signed numbers from the MLC, a data conversion by subtracting the value $2^{2-1}$ from the comparison result generated by the sense amplifier may be utilized to obtain the weight data of the signed numbers.

FIG. 3C illustrates tables 300c, 300d of a read operation performed on TLCs when weight data are respectively unsigned and signed numbers, in accordance with some embodiments. The table 300c shows the stored weight data of the unsigned numbers, weight values corresponding to the weight data, and electrical characteristics, including cell resistance and conductance, of the programmed TLC. The table 300d shows the stored weight data of the signed numbers, weight values corresponding to the weight data, and electrical characteristics, including cell resistance and conductance, of the programmed TLC. Similar to the tables 300a, 300b discussed above, table 300c shows that a sequential order of the weight values and a bit order of the weight data are the same, so an order of the electrical characteristics, particularly the conductance, read from the TLC also follow the bit order of the weight data. The table 300d shows that a sequential order of the weight values and a bit order of the weight data are different, which causes an order of the electrical characteristics, particularly the conductance, read from the TLC to be inconsistent with the bit order of the weight data.

Figure 3D:
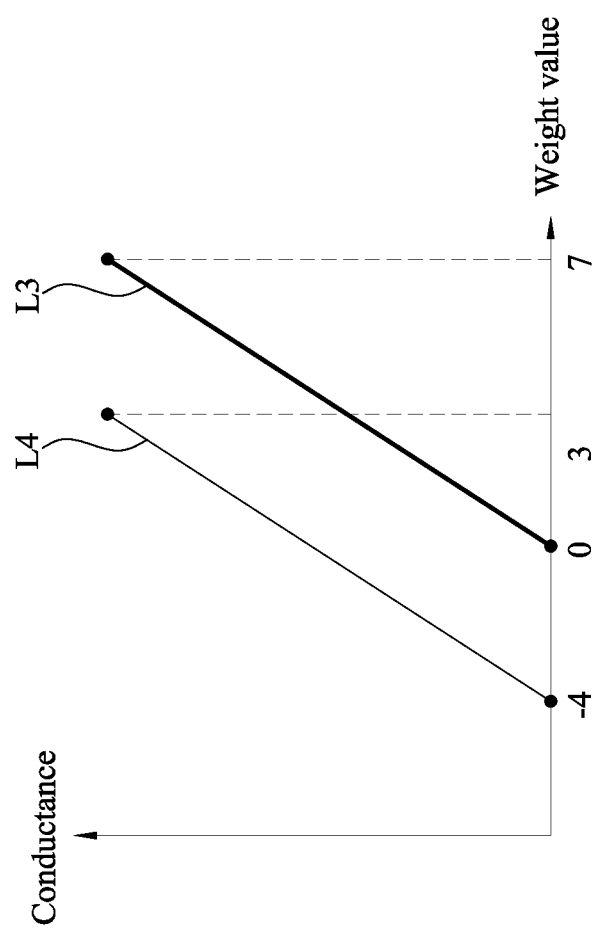
FIG. 3D illustrates a data conversion performed by a readout circuit when a read operation is performed on a TLC storing weight data of signed numbers, in accordance with some embodiments.

FIG. 3D illustrates a data conversion performed by the readout circuit 124 when the read operation is performed on a TLC storing weight data of signed numbers, in accordance with some embodiments. Two lines L3, L4 are illustrated in FIG. 3D, respectively corresponds to relationships between the conductance and the weight values of the unsigned and signed numbers. In at least one embodiment, the readout circuit 124 reads the conductance of the TLC and generates a first readout data of unsigned data. The first readout data corresponds to the data listed in the second column of the table 300d illustrated in FIG. 3C, and also covers a range of weight values from 0 to 7 illustrated on the line L3 in FIG. 3D. In order to convert the first readout data from unsigned to signed, the line L3 is required to be left-shifted by an offset of $2^{n-1}$ to the line L4, where n is the number of bits are carried by each weight data, i.e., 3, in this embodiment. The operation of shifting the line L3 left by $2^{n-1}$ corresponds to a data conversion of subtracting $2^{n-1}$ from the first readout data. For example, with reference to the fifth row in the table 300d, where the readout data is 011, by subtracting the data 100, which corresponds to a binary value $2^{3-1}$, a signed readout data 111 corresponding to the weight data programmed on the TLC is calculated. Thus, during the read operation to read the weight data of signed numbers from TLC, a data conversion by subtracting the value $2^{3-1}$ from the comparison result generated by the sense amplifier may be utilized to obtain the weight data of the signed numbers.

Figure 4A:
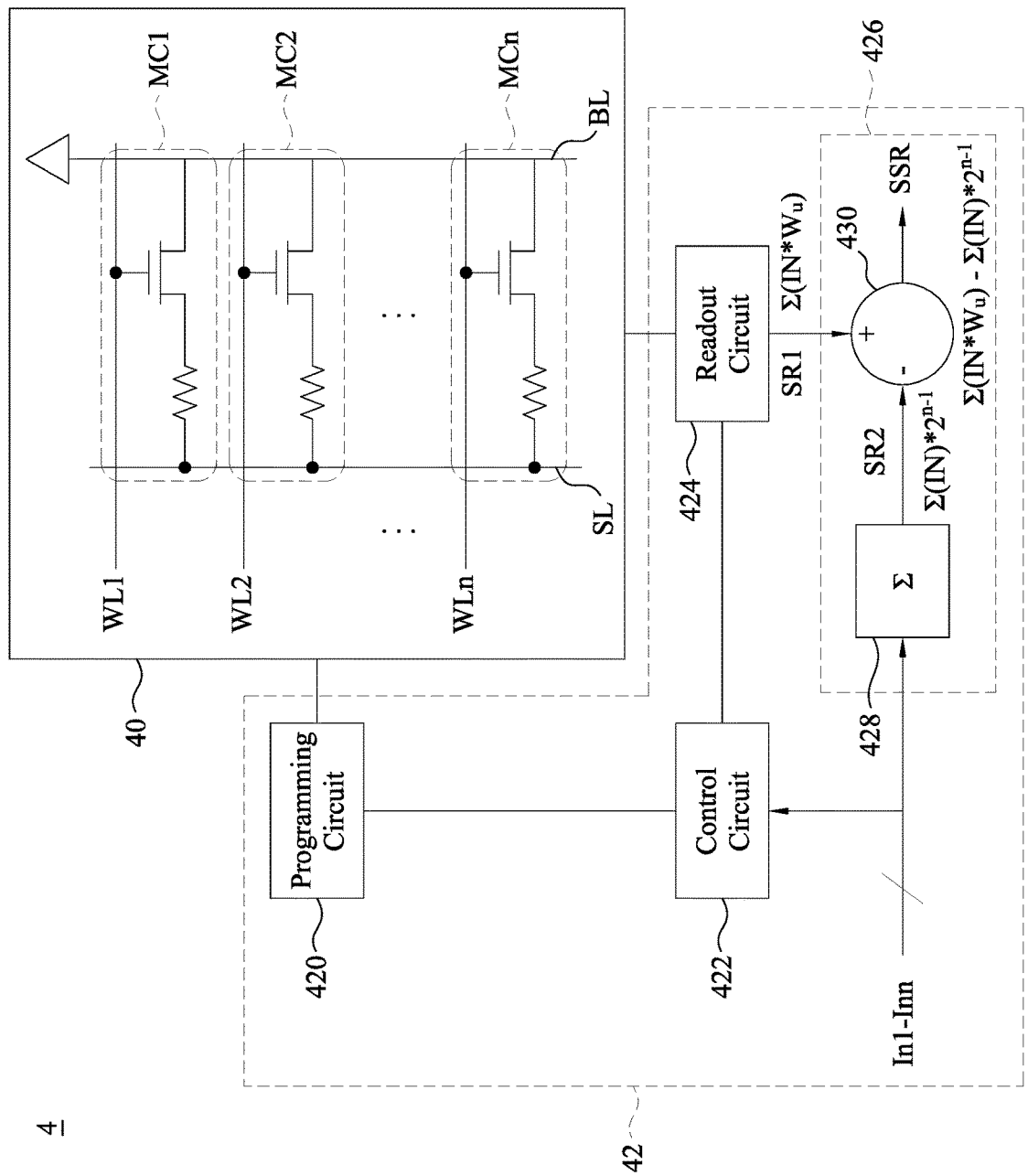
FIG. 4A illustrates a memory system, in accordance with some embodiments.

FIG. 4A illustrates a memory system 4, in accordance with some embodiments. The memory system 4 may be utilized for performing a compute-in-memory (CiM) operation. The memory system 4 comprises a memory array 40 and a processing circuit 42 coupled to the memory array 40. The processing circuit 42 is configured to control operations of the memory array 40. The processing circuit 42 is configured to perform at least one of a write operation and/or a read operation to the memory array 40.

The memory array 40 includes a plurality of memory cells MC1-MCn respectively coupled to word lines WL1-WLn. Each of the memory cells MC1-MCn has one terminal coupled to a source line SL and another terminal coupled to a bit line BL, while a control terminal of each memory cell is controlled by a corresponding one of the word lines. In at least one embodiment, each memory cell comprises a memory element and a selector coupled in series between the source line SL and the bit line BL. A control terminal of the selector is coupled to a corresponding one of the word lines, so the memory cell is controlled to be enabled or disabled by a voltage provided on the word line. Electrical characteristics (e.g., resistance or threshold voltage or other suitable electrical characteristics) of each memory element can be programed at different levels. Therefore, the memory cell is capable of storing data by programming electrical characteristics of the memory element at a corresponding level. Although only one source line and one bit line are illustrated in FIG. 4A, various numbers of word lines and/or bit lines and/or source lines in the memory array 40 are within the scope of various embodiments.

The processing circuit 42 comprises a programming circuit 420, a control circuit 422, a readout circuit 424, and a shift converter 426. In at least one embodiment, the processing circuit 42 further includes one or more clock generators for providing clock signals for various components of the memory system 4, one or more input/output (I/O) circuits for data exchange with external devices, and/or one or more controllers for controlling various operations of the memory system 4.

The programming circuit 420 is coupled to the memory cells MC1-MCn of the memory array 40 through the bit line BL and the source line SL to perform write operations on the memory cells MC1-MCn of the memory array 40. In at least one embodiment, the processing circuit 42 further includes a word line driver (also referred as "word line decoder") coupled to the memory array 40 via the word lines. The word line driver is configured to decode a row address of a selected memory cell, selected to be accessed in a read operation or a write operation. Further, details regarding write operations are described above with reference to FIGS. 2A, 2B and are not repeated here.

The readout circuit 424 is coupled to the memory cells MC1-MCn of the memory array 40 through the bit line BL to perform the read operation on at least one memory cell of the memory array 40. In at least one embodiment, the readout circuit 424 further includes a sense amplifier coupled to the memory array 40 via the bit lines. The sense amplifier is configured to read a level of an equivalent electrical characteristic of the enabled memory cells MC1-MCn from the bit line BL in a read operation. Further, the readout circuit 424 generates a summation result SR1 linearly related to the equivalent electrical characteristic received from the bit line BL.

The control circuit 422 is coupled to the programming circuit 420 and the readout circuit 424 to control the write operation and/or the read operation performed on the memory array 40. In at least one embodiment, the control circuit 422 is configured to receive a plurality of weight data corresponding to a plurality of weight values, and control the programming circuit 420 to perform the write operation on the memory cells, so the electrical characteristics of the memory cells can be programmed to follow an order of the weight values. In at least one embodiment, the electrical characteristics of the memory cells are programmed following a sequential order of the weight values. Examples of the control circuit 422 includes, include, but are not limited to, a central processing unit (CPU), a memory controller, a microprocessor control unit (MCU), an application specific integrated circuit, (ASIC), circuit implementations of field programmable gate array (FPGA), or circuit implementations from hardware description languages (e.g., Verilog, VHDL), or the like. Other types or configurations of control circuits 422 are also within the scope of various embodiments.

FIG. 4B illustrates a table 400a showing weight values and memory cell resistance values for a read operation performed by the readout circuit 424 when the weight data are signed numbers, in accordance with some embodiments. In this embodiment, four memory cells MC1-MC4 are disposed in parallel between the source line SL and the bit line BL in the memory array 40, while all memory cells MC1-MC4 are controlled to be enabled by the word lines WL1-WL4. Further, each of the memory cells MC1-MC4 is an MLC, capable of storing two bits of weight data.

The table 400a shows the weight values stored by the memory cells MC1-MC4, the cell resistances of the memory cells MC1-MC4, and equivalent resistance Req and conductance 1/Req of the parallel disposed memory cells MC1-MC4. More particularly, the table 400a shows the read operation performed on the memory cells MC1-MC4 stored with negative weight values. In this example, an electrical characteristic of each memory cell is programmed following a sequential order of the weight values rather than a bit order of the weight data. More particularly, a cell resistance of each memory cell is programmed to be inversely proportional to the weight value, while the conductance is directly proportional to the weight value. Therefore, the conductance of each memory cell is in a linear relationship with the corresponding weight value.

As seen in the table 400a, a total conductance 1/Req of the memory cells MC1-MC4 is also proportional to a summation of the weight values programmed in the memory cells MC1-MC4. In other words, the linear relationship between the programmed conductance and the stored weight value of each memory cell is also preserved in the memory cells of a same bit line when the weight data are signed numbers. This linear relationship enables the readout circuit 424 to obtain the summation result SR1 linearly related to a summation of the weight values through a total current on the bit line BL. As a result, the summation of the weight values on the same bit line may be performed and obtained by the readout circuit 424 by receiving a total current of the memory cells on a same bit line, without additional circuits required for converting signed and unsigned numbers before addition. Therefore, the readout circuit 424 is capable of summing signed and/or unsigned numbers stored in the memory cells coupled to a same bit line by performing the read operation. In at least one embodiment, the summation result SR1 generated by the readout circuit 424 is unsigned data, so the summation result SR1 is in a linear relationship with the weight values, as discussed above in relation to FIGS. 3A-3D.

In at least one embodiment, a CiM operation is performed by the memory system 4 for calculating a sum of products (SOP) result. In at least one embodiment, input data In1-Inn are received by the control circuit 422 to respectively control voltages on the word lines WL1-WLn, so each memory cells MC1-MCn may be accordingly enabled or disabled. For example, when input data with an input value 1 is received, a read voltage may be provided by the address decoder to a corresponding word line to enable the selected memory cell. Otherwise, when input data with an input value 0 is received, the corresponding memory cell is disabled. Thus, each memory cell is enabled or disabled according to the corresponding input data, and a total current corresponding to a summation of the conductance of the enabled memory cells is provided to the bit line BL. The total current flowing through the bit line BL is equivalent to the SOP result of the input data In1-Inn respectively being multiplied with the weight data stored by the memory cells MC1-MCn. In other words, the SOP result of the input data In1-Inn respectively being multiplied with the weight data stored by the memory cells MC1-MCn is obtained while performing the read operation on the memory cells MC1-MCn, thereby achieving the CiM operation.

However, since the summation result SR1 generated by the readout circuit 424 is unsigned data, additional data conversion is required when the weight data stored in the memory cells are signed numbers. In at least one embodiment, the shift converter 426 is coupled to the readout circuit 424, and is configured to generate a signed summation result SSR based on the summation result SR1 from the readout circuit 424. Specifically, as described above in relation to FIGS. 3A-3D, the summation result SR1 is unsigned data following a sequential order of the weight values, which is different from a bit order of the signed weight data. Thus, the shift converter 426 is disposed in the processing circuit 42. The shift converter 426 is coupled to the readout circuit 424 and configured to generate the signed summation result SSR by converting the summation result SR1 into signed data using two's complement notation.

In at least one embodiment, the shift converter 426 includes an accumulator 428 and a subtractor 430. The accumulator 428 is configured to receive and sum the input data In1-Inn, and multiply a summation of the input data In1-Inn by $2^{n-1}$ to generate a summation result SR2. The subtractor 430 is coupled to the accumulator 428, and configured to subtract the summation result SR2 from the summation result SR1 to generate the signed summation result SSR.

Specifically, the multiplication and accumulation result between the input data In1-Inn and the weight data stored by the memory cells MC1-MCn may be derived as follows.

$$In1 \times W_{s1} + In2 \times W_{s2} + \ldots + Inn \times W_{sn} =$$
$$In1 \times (W_{u1} - 2^{n-1}) + In2 \times (W_{u2} - 2^{n-1}) + \ldots + Inn \times (W_{un} - 2^{n-1}) =$$
$$(In1 \times W_{u1} + In2 \times W_{u2} + \ldots + Inn \times W_{un}) + (In1 + \ldots + Inn) \times (-2^{n-1}) =$$
$$(In1 \times W_{u1} + In2 \times W_{u2} + \ldots + Inn \times W_{un}) - 2^{n-1} \times \sum In = SR1 - SR2,$$

where $W_{s1}$ to $W_{sn}$ respectively denote the weight data to be stored in the memory cells MC1-MCn, and $W_{u1}$ to $W_{un}$ respectively denote the unsigned weight data read from the corresponding memory cells. As described above in relation to FIGS. 3A-3D, each signed weight data is equivalent to corresponding unsigned data by subtracting $2^{n-1}$. Thus, in the derivations above, each signed weight data $W_{sn}$ may be substituted by the corresponding unsigned weight data $W_{un}$ from which $2^{n-1}$ is subtracted. Further, the SOP result of the input data In1-Inn respectively multiplied by the signed weight data $W_{s1}$-$W_{sn}$ may be organized as a summation of two parts. The first part is equal to a sum of products of the input data In1-Inn being multiplied with the unsigned weight data $W_{u1}$-$W_{un}$, which corresponds to the summation result SR1. The second part is equal to a summation of input data In1-Inn multiplied by $(-2^{n-1})$, which corresponds to a negative value of the summation result SR2. As a result, the SOP result of the input data In1-Inn respectively multiplied by the signed weight data $W_{s1}$-$W_{sn}$ may be obtained by subtracting the summation result SR2 from the summation result SR1 based on the derivations above. Therefore, through operation of the accumulator 428 and the subtractor 430, the signed summation result SSR may be generated when the weight data are signed numbers. In some embodiments, the shift converter 426 is enabled when the weight data are signed numbers. Otherwise, when the weight data are unsigned numbers, the shift converter 426 is disabled and the summation result SR1 may be provided as the SOP result of the input data and the weight value.

Figure 5A:
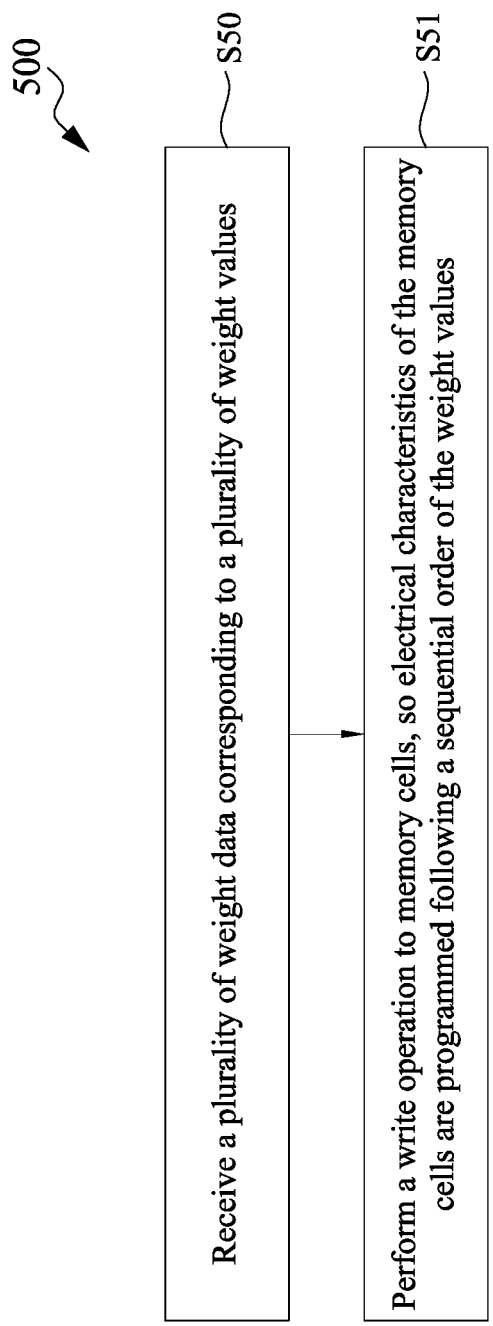
FIG. 5A illustrates a flowchart of an operating method, in accordance with some embodiments.

FIG. 5A illustrates a flowchart of an operating method 500, in accordance with some embodiments. The operating method 500 may be implemented and executed by the memory systems 1 and 4 as illustrated in FIGS. 1 and 4A. The operating method 500 includes steps S50, S51.

Although the memory array 40 in FIG. 4A is a NAND-type memory array, other types of memory array, such as a NOR type memory array, are also applicable. For example, the memory cells in the NOR type memory array can be coupled in series, while the computation result can be obtained through a measurement on a voltage or an equivalent resistance of the serially coupled memory cells. In addition, the resistance and/or conductance values in FIGS. 2A-2B, 3A-3D, 4B are only for exemplary purposes. Person skilled in the art can make modifications on the electrical values of the memory cells, so the memory system can be adapted to various design concepts and system requirements.

In step S50, a plurality of weight data corresponding to a plurality of weight values is received. In step S51, a write operation is performed on memory cells, so that the electrical characteristics of the memory cells are programmed following a sequential order of the weight values.

More specifically, the received weight data may be signed or unsigned numbers. Since a bit order of the weight data and a sequential order of the weight values for the unsigned numbers are the same, but different for the signed numbers, an additional conversion is required to be performed by the control circuit 122 or control circuit 422 while performing the write operation of the signed numbers, so the electrical characteristic of the memory cell can be programmed following the sequential order of the corresponding weight value. In at least one embodiment, the program operation may be performed by accessing programming parameters through a register according to not only the received data but also an identification result as to whether the weight data is signed.

Figure 5B:
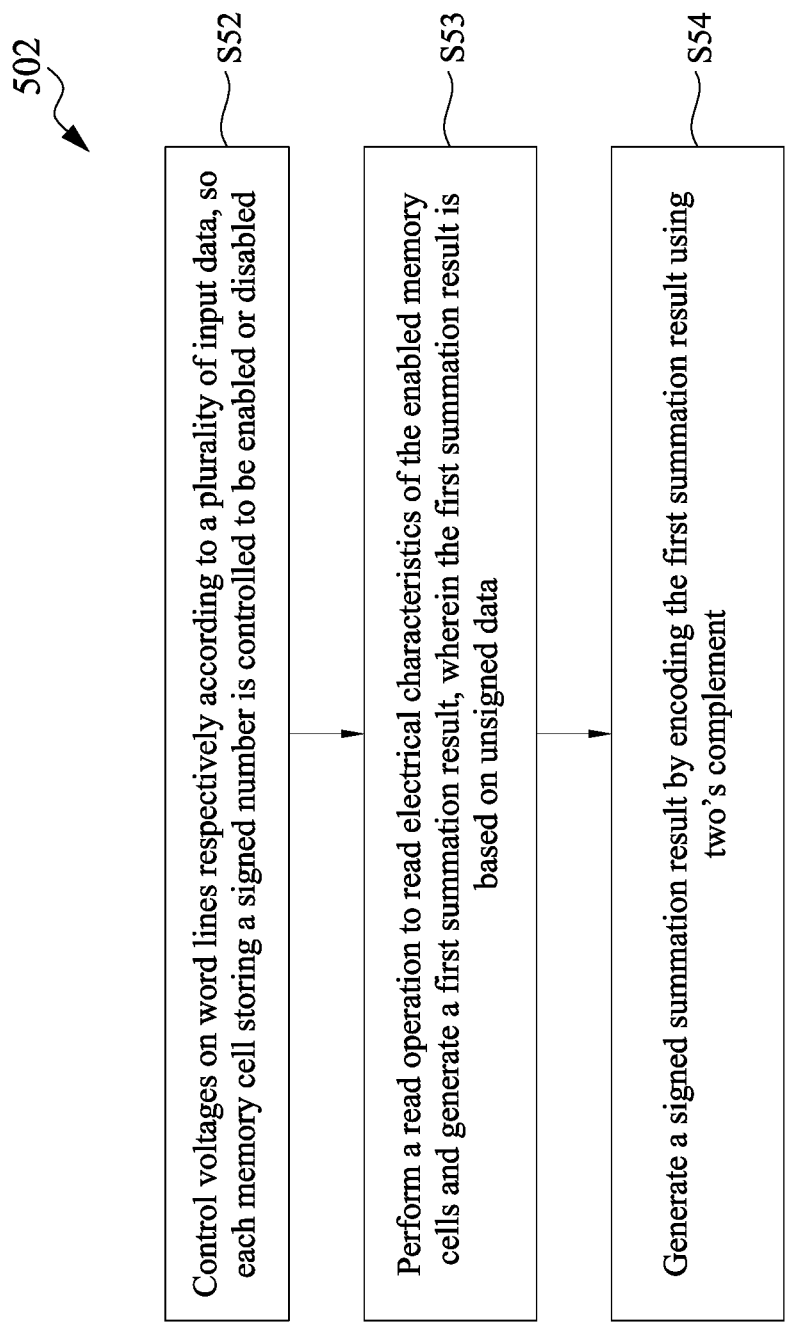
FIG. 5B illustrates a flowchart of another operating method, in accordance with some embodiments.

FIG. 5B illustrates a flowchart of another operating method 502, in accordance with some embodiments. The operating method 502 includes steps S52-S54. The operating method 502 may be implemented and executed by the memory systems 1 and 4 illustrated in FIGS. 1 and 4A. The operating method 502 includes steps S52-S54.

In step S52, voltages on the word lines are respectively controlled according to a plurality of input data, so each memory cell storing a signed number is controlled to be enabled or disabled. In step S53, a read operation is performed to read electrical characteristics of the enabled memory cells and generate a first summation result, wherein the first summation result is based on unsigned data. In step S54, a signed summation result is generated by encoding the first summation result using two's complement notation.

More specifically, an electrical characteristic of each memory cell is programmed to store weight data of a signed number. The electrical characteristics are programmed to follow a sequential order of weight values corresponding to the weight data. More particularly, the electrical characteristics are programmed to be linearly related to the weight values, so the first summation result of the weight values can be obtained through reading an equivalent electrical characteristic of the memory cells in step S53. However, since the electrical characteristics are linearly related to the weight values, the first summation result obtained from the electrical characteristics of the memory cells corresponds to unsigned data. Thus, a data conversion from the unsigned first summation to the signed summation result is required in step S54.

In at least one embodiment, a memory system for performing a computing-in-memory (CiM) operation comprises a memory array and a processing circuit. The memory array comprises a plurality of memory cells. The processing circuit is coupled to the memory array. The processing circuit comprises a programming circuit and a control circuit. The programming circuit is coupled to the memory array and configured to perform a write operation for programming electrical characteristics of the memory cells. The control circuit is coupled to the programming circuit and configured to: receive a plurality of weight data corresponding to a plurality of weight values; and control the write operation performed by the programming circuit, so the electrical characteristics of the memory cells are programmed following a sequential order of the weight values.

In at least one embodiment, a memory system for performing a computing-in-memory (CiM) operation comprises a memory array and a processing circuit. The memory array comprises a plurality of memory cells respectively storing a plurality of weight data corresponding to a plurality of weight values. The plurality of weight data are signed numbers. The memory cells are coupled to a bit line and respectively controlled by a plurality of word lines. The processing circuit is coupled to the memory array. The processing circuit comprises a control circuit, a readout circuit, and a shift converter. The control circuit is coupled to the programming circuit and configured to: receive a plurality of input data corresponding to a plurality of input values; and control voltages on the word lines respectively according to the plurality of input data, so each memory cell is controlled to be enabled or disabled. The readout circuit is coupled to the bit line and configured to perform a read operation to read electrical characteristics of the enabled memory cells and generate a first summation result, wherein the first summation result is based on unsigned data. The shift converter is coupled to the readout circuit and configured to generate a signed summation result by encoding the first summation result using two's complement.

In at least one embodiment, a memory array comprises a plurality of memory cells respectively storing a plurality of weight data corresponding to a plurality of weight values, the memory cells being coupled to a bit line and respectively controlled by a plurality of word lines. An operating method for operating the memory array comprises: controlling voltages on the word lines respectively according to a plurality of input data, so each memory cell is controlled to be enabled or disabled; performing a read operation to read electrical characteristics of the enabled memory cells and generate a first summation result, wherein the first summation result is an unsigned data; and generating a signed summation result by encoding the first summation result using two's complement notation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system for performing a computing-in-memory (CiM) operation, the memory system comprising:
   a memory array comprising a plurality of memory cells, the memory cells being coupled to a bit line and respectively controlled by a plurality of word lines; and
   a processing circuit coupled to the memory array, the processing circuit comprising:
      a programming circuit coupled to the memory array and configured to perform a write operation for programming electrical characteristics of the memory cells; and
      a control circuit coupled to the programming circuit and configured to:
         receive a plurality of weight data corresponding to a plurality of weight values; and
         control the write operation performed by the programming circuit, so the electrical characteristics of the memory cells are programmed following a sequential order of the weight values;
      a readout circuit coupled to the control circuit and configured to perform a read operation on the memory cells, for reading the electrical characteristics of the memory cells to generate a first summation result corresponding to a sum of products of a plurality of input values multiplied by the weight values; and
      a shift converter coupled to the readout circuit and configured to generate a signed summation result by encoding the first summation result using two's complement notation.

2. The memory system of claim 1, wherein the plurality of weight data are signed numbers encoded in two's complement notation.

3. The memory system of claim 1, wherein the electrical characteristics of the memory cells are programmed, so the electrical characteristic increases as the corresponding weight value increases.

4. The memory system of claim 1, wherein the electrical characteristic of each memory cell is programmed to be proportional to the corresponding weight value.

5. The memory system of claim 1, wherein the control circuit is further configured to:
   receive a plurality of input data corresponding to the plurality of input values; and
   control voltages on the word lines respectively according to the plurality of input data, to control each memory cell to be enabled or disabled.

6. The memory system of claim 5, wherein the readout circuit is further configured to read a total current generated by an enabled one or more of the memory cells coupled to the bit line, to generate the first summation result.

7. The memory system of claim 1, wherein the first summation result is linearly related with an equivalent electrical characteristic of the memory cells.

8. The memory system of claim 1, wherein the first summation result is based on unsigned data.

9. The memory system of claim 1, wherein the shift converter comprises:
an accumulator configured to receive and sum the plurality of input data, and multiply a summation of the input data by $2^{n-1}$ to generate a second summation result, where n is a bit number of the weight data; and
a subtractor configured to subtract the second summation result from the first summation result to generate the signed summation result.

10. The memory system of claim 1, wherein the shift converter is enabled when the plurality of weight data are signed numbers.

11. The memory system of claim 1, wherein one of the memory cells comprises:
a memory element and a selector coupled in series between a source line and the bit line, wherein the selector is coupled to a corresponding one of the word lines.

12. The memory system of claim 1, wherein the processing circuit comprises at least one clock generator.

13. The memory system of claim 1, wherein the readout circuit comprises a sense amplifier coupled to the memory array via the bit line and configured to read a level of an equivalent electrical characteristic of one or more enabled ones of the memory cells from the bit line in the read operation.

14. The memory system of claim 1, wherein cell resistances of the memory cells are programmed to be inversely proportional to the weight values.

15. A memory system for performing a computing-in-memory (CiM) operation, the memory system comprising:
a memory array comprising a plurality of memory cells, the memory cells being coupled to a bit line and respectively controlled by a plurality of word lines; and
a processing circuit coupled to the memory array, the processing circuit comprising:
a programming circuit coupled to the memory array and configured to perform a write operation for programming electrical characteristics of the memory cells; and
a control circuit coupled to the programming circuit and configured to:
receive a plurality of weight data corresponding to a plurality of weight values; and
control the write operation performed by the programming circuit, so the electrical characteristics of the memory cells are programmed following a sequential order of the weight values; and
a readout circuit coupled to the bit line and configured to perform a read operation on the memory cells, for reading the electrical characteristics of the memory cells to generate, based on unsigned data, a first summation result corresponding to a sum of products of a plurality of input values multiplied by the weight values.

16. The memory system of claim 15, wherein the electrical characteristics of the memory cells are programmed, so the electrical characteristic increases as the corresponding weight value increases.

17. The memory system of claim 15, wherein the electrical characteristic of each memory cell is programmed to be proportional to the corresponding weight value.

18. A circuit for performing a computing-in-memory (CiM) operation, the circuit comprising:
a programming circuit coupled to a memory array having a plurality of memory cells coupled to a bit line and respectively controlled by a plurality of word lines;
a control circuit coupled to the programming circuit and configured to:
receive a plurality of weight data corresponding to a plurality of weight values; and
control a write operation performed by the programming circuit, to program electrical characteristics of the memory cells following a sequential order of the weight values; and
a readout circuit coupled to the control circuit and configured to perform a read operation on the memory cells, for reading the electrical characteristics of the memory cells to generate, based on unsigned data, a first summation result corresponding to a sum of products of a plurality of input values multiplied by the weight values.

19. The memory system of claim 18, wherein the electrical characteristics of the memory cells are programmed, so the electrical characteristic increases as the corresponding weight value increases.

20. The memory system of claim 18, wherein the electrical characteristic of each memory cell is programmed to be proportional to the corresponding weight value.

* * * * *